United States Patent
Yu et al.

(10) Patent No.: US 10,840,102 B2
(45) Date of Patent: Nov. 17, 2020

(54) INTEGRATED SYSTEM, INTEGRATED SYSTEM OPERATION METHOD AND FILM TREATMENT METHOD

(71) Applicant: Taiwan Semiconductor Manufacturing CO., LTD., Hsinchu (TW)

(72) Inventors: Weibo Yu, Hsinchu (TW); Wen-Yu Ku, Hsinchu (TW); Kuo-Sheng Chuang, Hsinchu (TW); Chin-Hsiang Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 58 days.

(21) Appl. No.: 14/091,630

(22) Filed: Nov. 27, 2013

(65) Prior Publication Data

US 2015/0147826 A1    May 28, 2015

(51) Int. Cl.
| | | |
|---|---|---|
| *H01L 21/306* | (2006.01) | |
| *H01L 21/67* | (2006.01) | |
| *H01L 21/66* | (2006.01) | |
| *G01B 11/06* | (2006.01) | |

(52) U.S. Cl.
CPC .... *H01L 21/30604* (2013.01); *G01B 11/0641* (2013.01); *H01L 21/67253* (2013.01); *H01L 22/20* (2013.01); *G01N 2201/025* (2013.01); *G01N 2201/061* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 5,311,285 | A * | 5/1994 | Oshige et al. | 356/369 |
| 5,438,415 | A * | 8/1995 | Kazama | G01B 11/065 356/367 |
| 7,102,763 | B2* | 9/2006 | Ritzdorf | H01L 21/67103 118/712 |
| 2003/0020928 | A1* | 1/2003 | Ritzdorf | H01L 21/67103 356/630 |
| 2003/0220708 | A1* | 11/2003 | Sahin | H01L 21/67253 700/121 |
| 2004/0151562 | A1* | 8/2004 | Hofmeister | H01L 21/67161 414/217 |
| 2005/0098535 | A1* | 5/2005 | Lansford | H01L 21/67253 216/59 |
| 2006/0058979 | A1* | 3/2006 | Markle | H01L 21/67276 702/155 |
| 2007/0012660 | A1* | 1/2007 | Lewington | G03F 1/30 216/60 |

(Continued)

FOREIGN PATENT DOCUMENTS

CN    101055422 A    10/2007

*Primary Examiner* — Charles Capozzi

(57) ABSTRACT

An integrated system operation method is disclosed that includes the following steps: the film of a substrate is measured by a metrology apparatus to obtain a film information. The substrate is moved from the metrology apparatus to a process apparatus adjacent to the transfer apparatus. The film information is sent to the process apparatus. A film treatment is applied to the substrate in accordance with the film information.

20 Claims, 12 Drawing Sheets

(56) References Cited

U.S. PATENT DOCUMENTS

| | | | |
|---|---|---|---|
| 2008/0140590 A1* | 6/2008 | Shen | G05B 19/41875 706/12 |
| 2008/0160652 A1* | 7/2008 | Bai | H01L 22/12 438/9 |
| 2009/0088895 A1* | 4/2009 | Schmidt | G05B 19/41865 700/228 |
| 2010/0112483 A1* | 5/2010 | Wing Ngai | 430/296 |
| 2010/0317129 A1* | 12/2010 | Basol | C25D 5/10 438/16 |
| 2011/0308453 A1* | 12/2011 | Su | C23C 16/303 118/708 |
| 2014/0078495 A1* | 3/2014 | Zhang | H01L 22/12 356/72 |

* cited by examiner

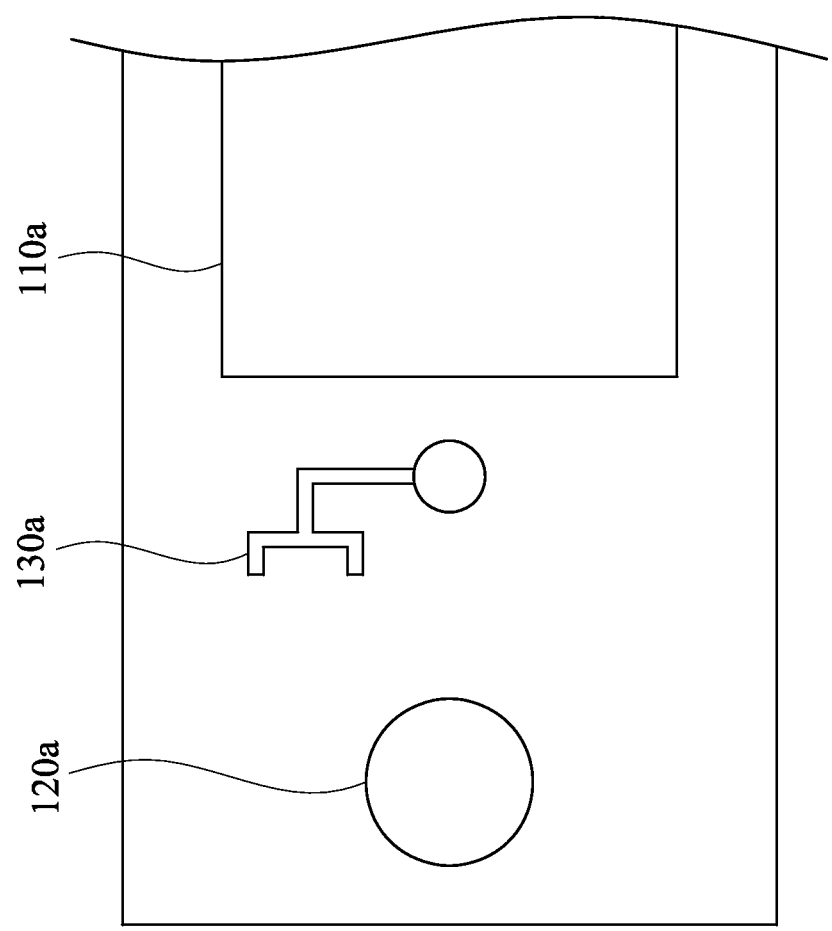

INTEGRATED SYSTEM, INTEGRATED SYSTEM OPERATION METHOD AND FILM TREATMENT METHOD

FIELD

The present disclosure relates to an integrated system, an integrated system operation method, and a film treatment method.

BACKGROUND

With the development of science and technology, there are different kinds of process equipments to apply serial treatments to manufacture semiconductor products, such as TFT devices, LED devices, or wafer substrates.

In order to control the quality of the semiconductor products, metrology equipments are required for measuring the deposition films of the substrates. For example, a wet etching equipment can etch a film formed on a substrate. After the film is etched, the substrate may be moved to an inspection station by a carrier, such as an ellipsometer that can measure the thickness of the film of the substrate. If the thickness of the film is too thick, it is needed to set an etching recipe to a dry etching equipment or a wet etching equipment to reduce the thickness of the film. If the thickness of the film is too thin, the substrate may be scraped or need to be top up by film deposition tool.

However, the inspection station may be far away from the aforesaid process equipments, the cycle time of checking, depositing, and etching the film of the substrate is difficult to reduce. Moreover, a deposition time or an etching time is required to calculate manually in accordance with the film information that is measured from the ellipsometer. As a result, the process control of the substrate cannot be improved due to different users' experiences.

BRIEF DESCRIPTION OF THE DRAWINGS

The disclosure can be more fully understood by reading the following detailed description of various embodiments, with reference to the accompanying drawings as follows:

FIG. 1A is a top schematic view of a position arrangement of a process apparatus, a metrology apparatus, and a transfer apparatus in accordance with some embodiments of the present disclosure;

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
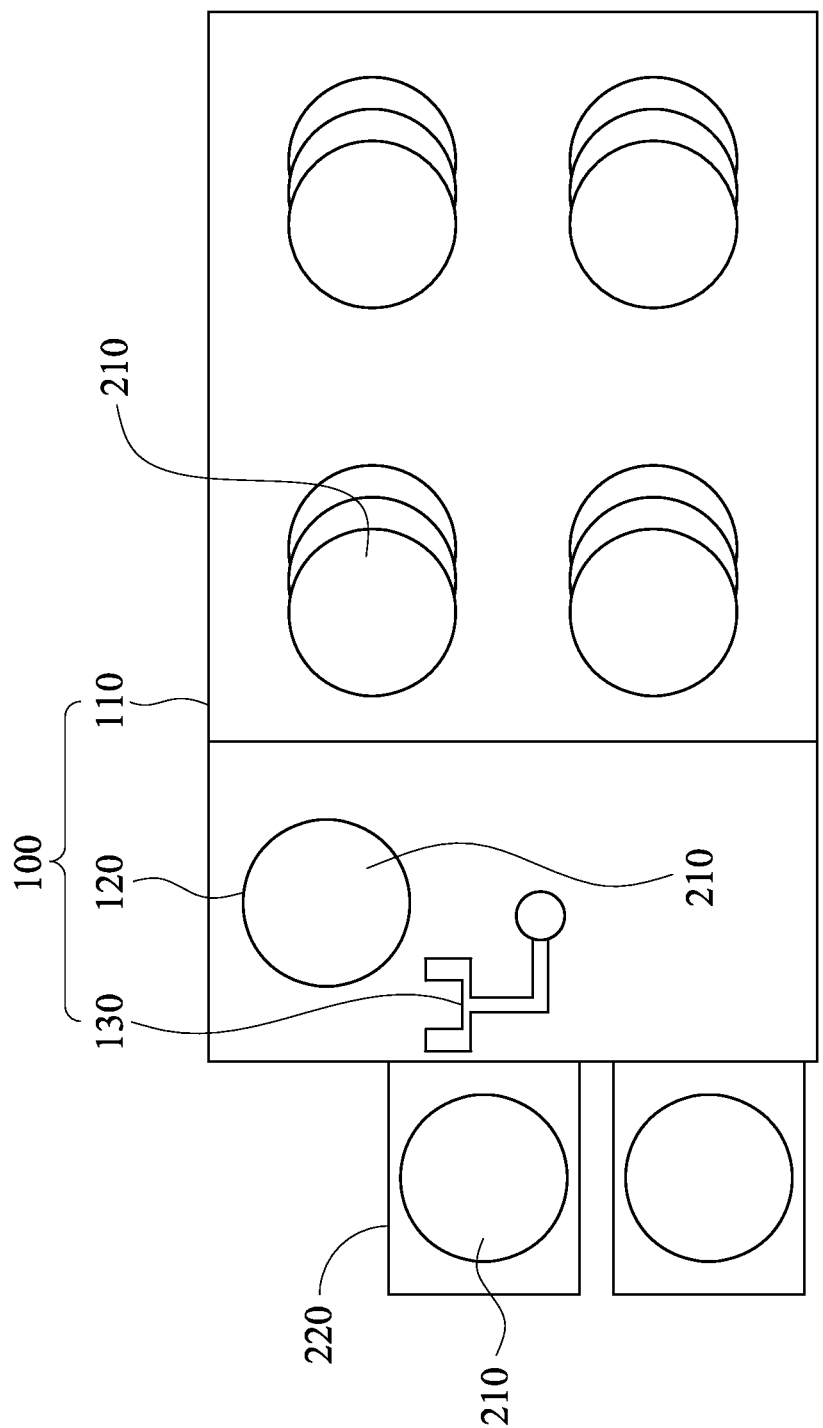
FIG. 1 is a top schematic view of an integrated system in accordance with some embodiments of the present disclosure.

FIG. 1 is a top schematic view of an integrated system 100 in accordance with some embodiments of the present disclosure. As shown in FIG. 1, the integrated system 100 includes a process apparatus 110, a metrology apparatus 120, and a transfer apparatus 130. The metrology apparatus 120 is immediately adjacent to the process apparatus 110. Moreover, the transfer apparatus 130 is electrically connected to the process apparatus 110 and the metrology apparatus 120.

When the integrated system 100 is in operation state, the substrate 210 may be moved to a port 220 of the integrated system 100. Thereafter, the transfer apparatus 130 can move the substrate 210 from the port 220 to the metrology apparatus 120, such that the metrology apparatus 120 can measure the film of the substrate 210 (e.g., measuring the film thickness of the substrate 210). Next, the transfer apparatus 130 moves the substrate 210 from the metrology apparatus 120 to the process apparatus 110, such that the process apparatus 110 can apply a film treatment to the substrate 210 (e.g., depositing a film or etching a film).

The aforesaid "the metrology apparatus 120 is immediately adjacent to the process apparatus 110" means that there is no other process stations between the metrology apparatus 120 and the process apparatus 110 except the transfer apparatus 130 that is used to move the substrate 210 between the metrology apparatus 120 and the process apparatus 110. In some embodiments, the metrology apparatus 120 is physically integrated to the process apparatus 110 within a common outer housing.

The substrate 210 may be a semiconductor element, such as a wafer, a thin film transistor (TFT) device, or a light emitting diode (LED) device, but the substrate 210 is not limited by the aforesaid electric elements. Moreover, the process apparatus 110 may be a chemical vapor deposition (CVD) chamber, a physical vapor deposition (PVD) chamber, a dry etching chamber, or a wet etching chamber; the metrology apparatus 120 may be an ellipsometer or an automated optical inspection (AOI) apparatus; the transfer apparatus 130 may be a automated robot, but the present disclosure is not limited in this regard.

When the process apparatus 110 is a deposition apparatus, the thickness of the film of the substrate 210 can be increased. When the process apparatus 110 is an etching apparatus, the thickness of the film of the substrate 210 can be reduced. Furthermore, when the metrology apparatus 120 is an ellipsometer, the thickness of the film of the substrate 210 can be obtained by the metrology apparatus 120.

Since the size of the substrate 210 may be large, such as a wafer with 450 mm diameter, a lot of chip products may be manufactured from the substrate 210. Therefore, the manufacturing cost and the price of the substrate 210 is increased considerably. If the substrate 210 suffers from vibrations in a previous process step, the metrology apparatus 120 can obtain the film information of the substrate 210 before the substrate 210 executing the process of the process apparatus 110. Moreover, if the substrate 210 suffers from vibrations in the process of the process apparatus 110, the metrology apparatus 120 can obtain the film information of the substrate 210 after the substrate 210 executing the process of the process apparatus 110. As a result, the integrated system 100 assures and improves the process stability of the substrate 210.

FIG. 1A is a top schematic view of a position arrangement of a process apparatus 110a, a metrology apparatus 120a, and a transfer apparatus 130a in accordance with some embodiments of the present disclosure. In some embodiments, the transfer apparatus 130a is located between the process apparatus 110a and the metrology apparatus 120a. That is to say, the process apparatus 110a and the metrology apparatus 120a are located at two opposite sides of the transfer apparatus 130a.

Figure 1B:
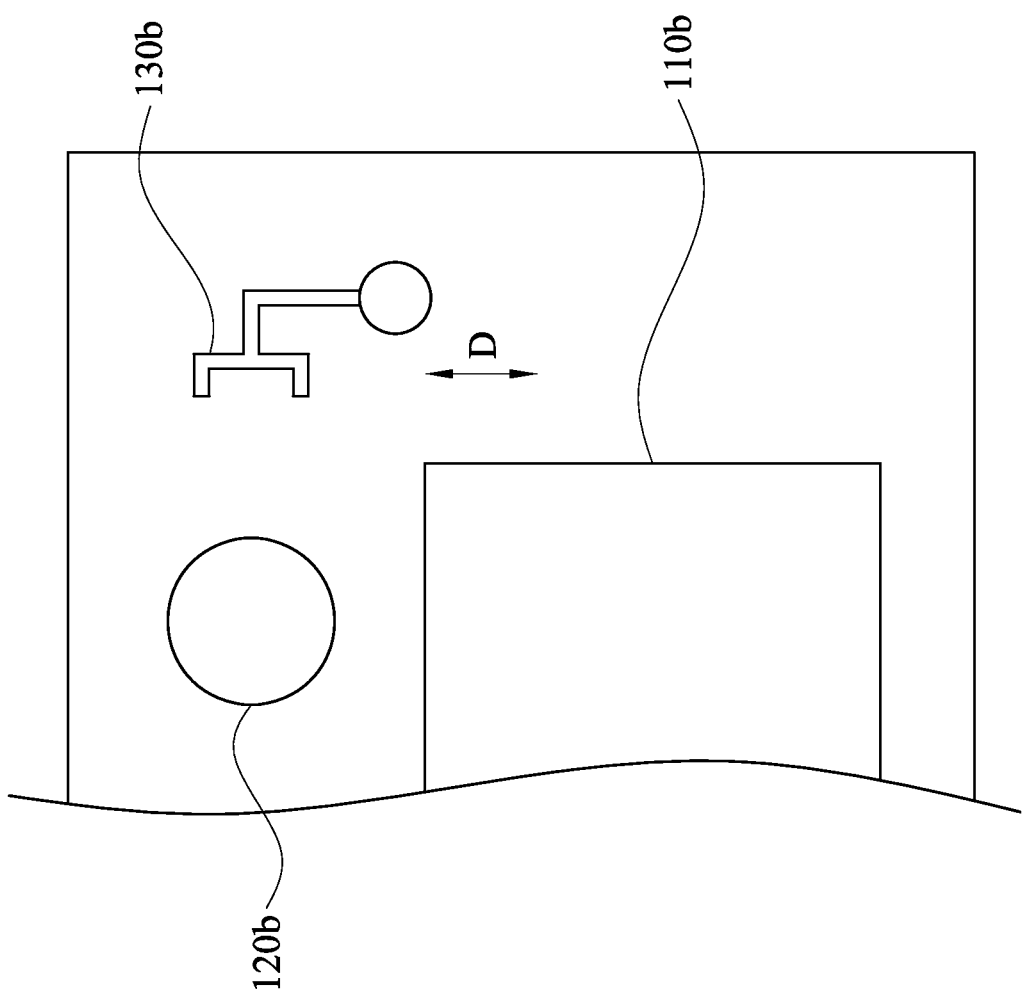
FIG. 1B is a top schematic view of a position arrangement of a process apparatus, a metrology apparatus, and a transfer apparatus in accordance with some embodiments of the present disclosure.

FIG. 1B is a top schematic view of a position arrangement of a process apparatus 110b, a metrology apparatus 120b, and a transfer apparatus 130b shown in FIG. 1A. In some embodiments, the process apparatus 110b and the metrology apparatus 120b are located at the same side. and the transfer apparatus 130b can move in a direction D along the process apparatus 110 and the metrology apparatus 120.

The aforementioned position arrangements of the process apparatus, the metrology apparatus and the transfer apparatus shown in FIG. 1, FIG. 1A, and FIG. 1B are only examples, and the present disclosure is not limited in this regard.

Figure 2:
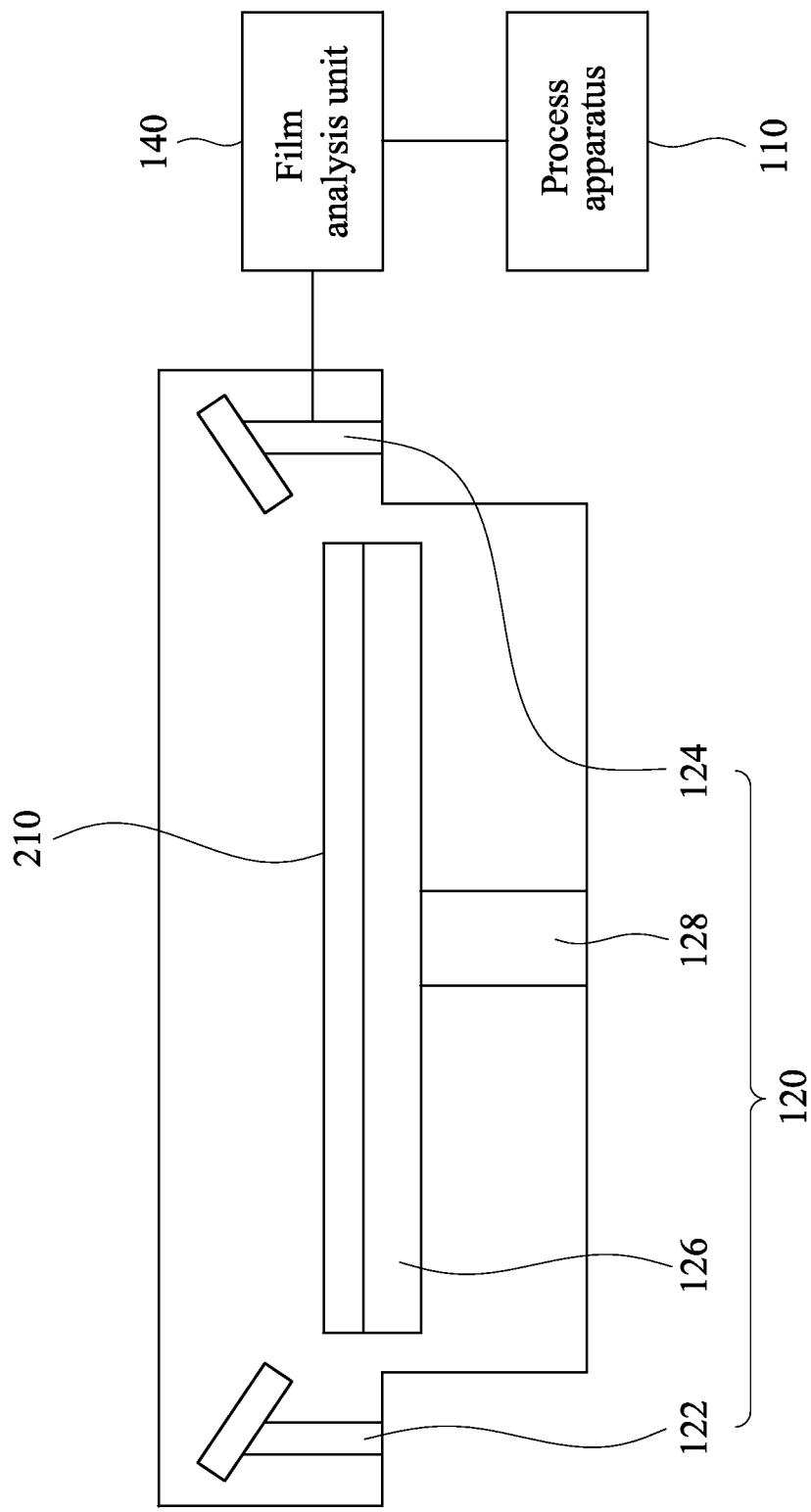
FIG. 2 is a side view of a metrology apparatus shown in FIG. 1 when measuring a substrate.

FIG. 2 is a side view of the metrology apparatus 120 shown in FIG. 1 when measuring the substrate 210. As shown in FIG. 1 and FIG. 2, in some embodiments, the metrology apparatus 120 includes a transmitter 122 and a receiver 124. The receiver 124 is electrically connected to the transmitter 122. When the substrate 210 is moved to the metrology apparatus 120 by the transfer apparatus 130, the transmitter 122 and the receiver 124 can be driven to measure the film of the substrate 210 to obtain a film information. For example, the transmitter 122 may emit a light to the film of the substrate 210, and the receiver 124 receives the light reflected by the film of the substrate 210 to obtain the film information.

Moreover, the integrated system 100 may include a film analysis unit 140. The film analysis unit 140 is electrically connected to the receiver 124 of the metrology apparatus 120. The film analysis unit 140 can automatically select a recipe to the process apparatus 110 in accordance with the film information measured by the metrology apparatus 120. The film analysis unit 140 may be located within the metrology apparatus 120 or the process apparatus 110, but the present disclosure is not limited in this regard.

In some embodiments, the metrology apparatus 120 may further includes a stage 126 and a motor 128. The stage 126 can support the substrate 210, and the motor 128 is connected to the stage 126. When the substrate 210 is on the stage 126 and measured by the transmitter 122 and the receiver 124, the stage 126 can be driven to rotate by the motor 128 at the same time, such that the precision of the film information can be improved. The transmitter 122 and the receiver 124 may be located above the stage 126, and each of transmitter 122 and the receiver 124 may include a charge coupled device (CCD) camera.

Figure 3:
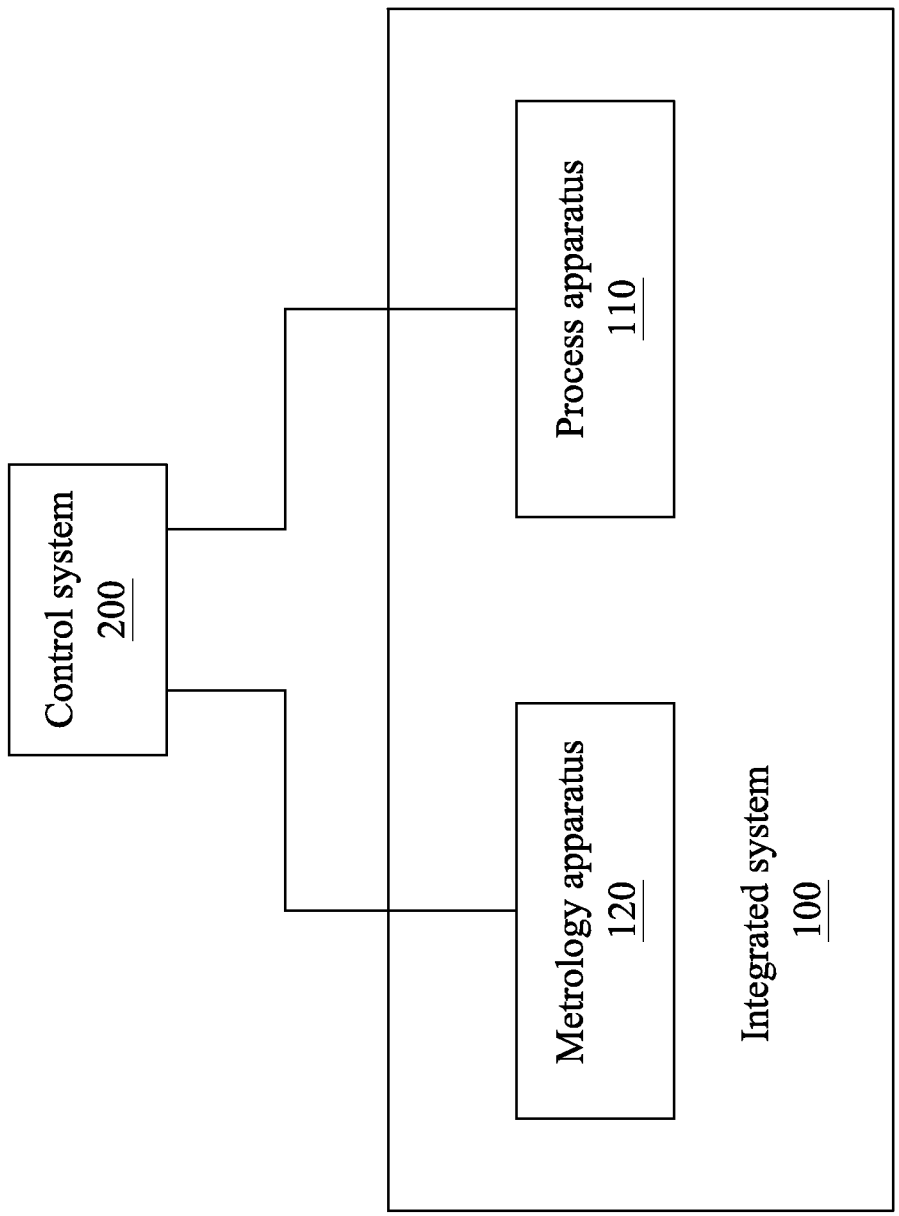
FIG. 3 is a block diagram of the integrated system shown in FIG. 1 that is electrically connected to a control system.

FIG. 3 is a block diagram of the integrated system 100 shown in FIG. 1 that is electrically connected to a control system 200. As shown in FIG. 1 and FIG. 3, the control system 200 is electrically connected to the process apparatus 110 and the metrology apparatus 120 of the integrated system 100, and the process apparatus 110 is electrically connected to the metrology apparatus 120. The integrated system 100 may be in a semiconductor fab when operating, the control system 200 may be a serial process control system or a fab control system for processing the substrate 210.

Figure 4:
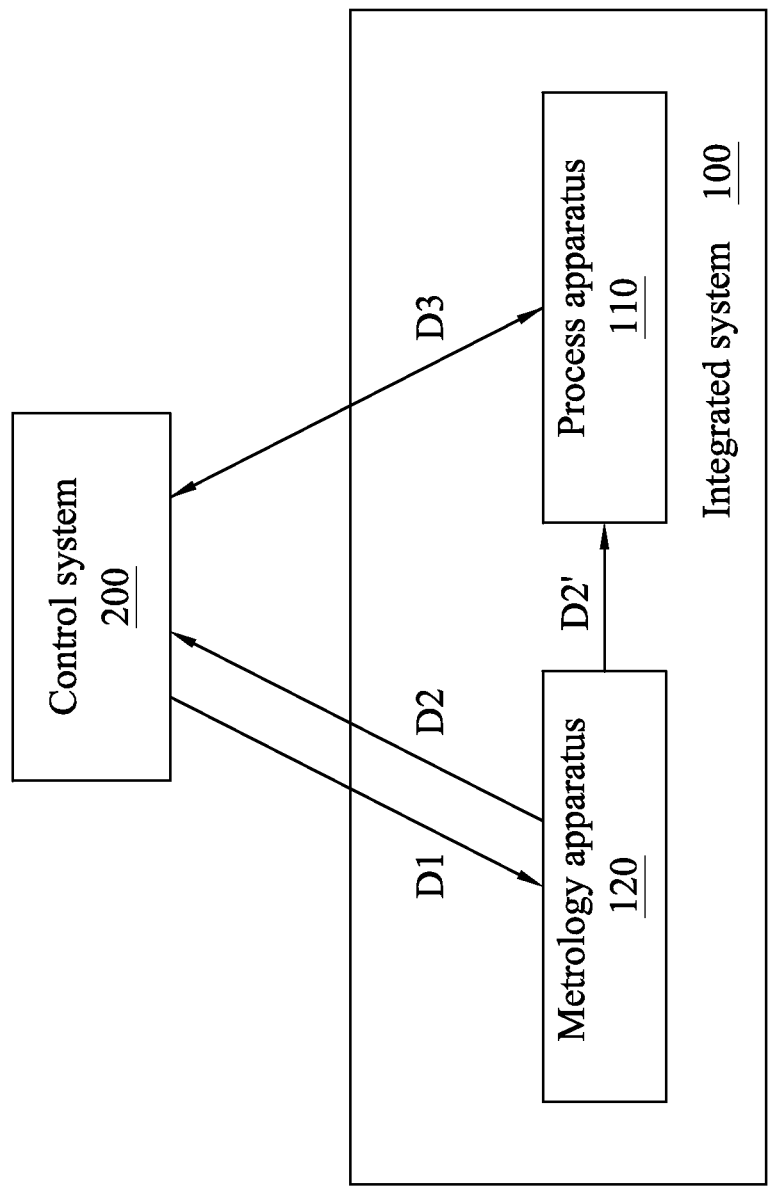
FIG. 4 is the block diagram shown in FIG. 3 when transmitting information.

FIG. 4 is the block diagram shown in FIG. 3 when transmitting information. As shown in FIG. 1 and FIG. 4, when the substrate 210 is loaded in metrology apparatus 120 from the port 220 by the transfer apparatus 130, the control system 200 can send measuring information D1 to the metrology apparatus 120, such that the metrology apparatus 120 measures the physical properties of the film of the substrate 210. The aforesaid physical properties may be the thickness of the film, the particles of the film, and the material of the film, but the present disclosure is not limited in this regard.

After the metrology apparatus 120 completes to measure the film of the substrate 210, the metrology apparatus 120 can send a film information D2 to the control system 200, and synchronously send a film information D2' to the process apparatus 110. At this moment, the substrate 210 can be loaded in the process apparatus 110 from the metrology apparatus 120 by the transfer apparatus 130. As a result, the measurement data of the film of the substrate 210 can be known from the control system 200, and the process apparatus 110 of the integrated system 100 can select an appropriate recipe to apply a treatment (e.g., depositing the film, etching the film, or cleaning the film) to the substrate 210 in accordance with the film information D2'.

When the process apparatus 110 applies the treatment to the substrate 210 in accordance with the film information D2', the process apparatus 110 can send process information D3 to the control system 200. After the process apparatus 110 complete the treatment for the substrate 210, the control system 200 can send process information D3 to the process apparatus 110, such that the substrate 210 is unloaded from the process apparatus 110 to the port 220 or the metrology apparatus 120 by the transfer apparatus 130. Thereafter, the substrate 210 may be moved to a next process step from the port 220, or may be measured again to check the modified film of the substrate 210 by the metrology apparatus 120.

It is to be noted that the connection relationships of the elements described above will not be repeated in the following description.

Figure 5:
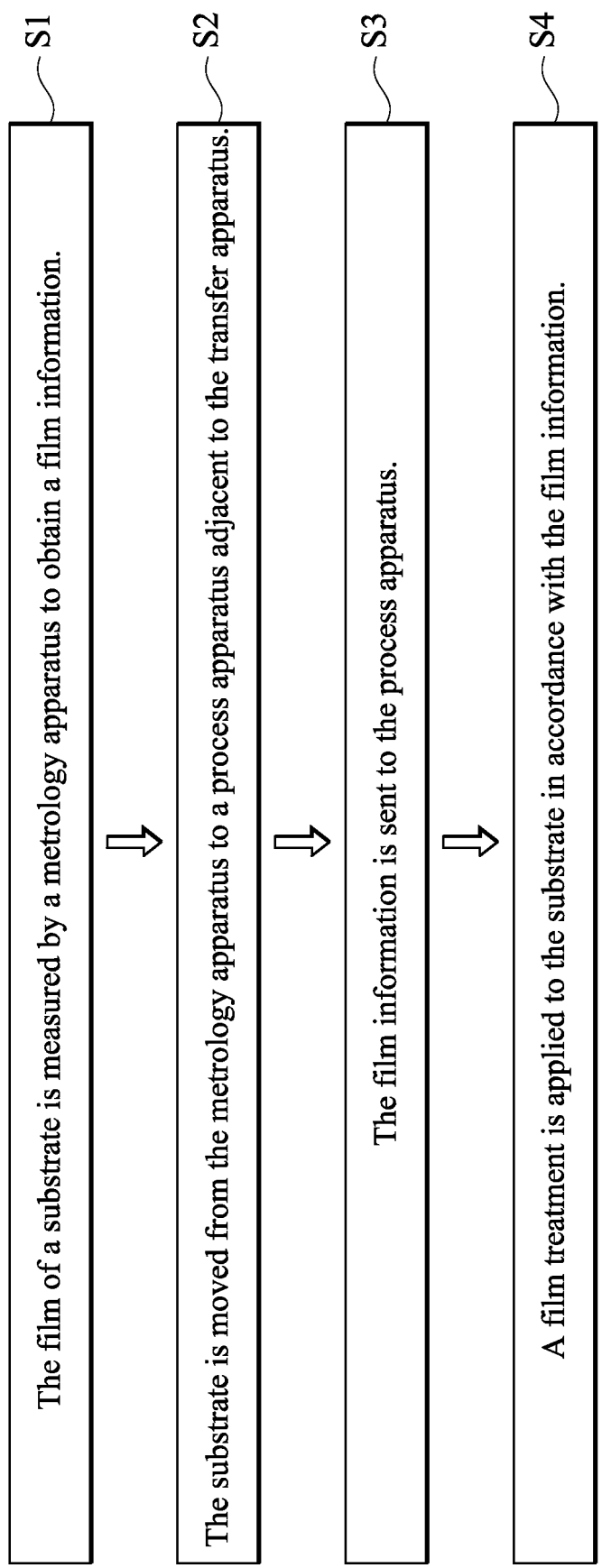
FIG. 5 is a flow chart of an integrated system operation method in accordance with some embodiments of the present disclosure.

FIG. 5 is a flow chart of an integrated system operation method in accordance with some embodiments of the present disclosure. As shown in FIG. 5, in step S1, the film of a substrate is measured by a metrology apparatus to obtain a film information. Next in step S2, the substrate is moved from the metrology apparatus to a process apparatus adjacent to the transfer apparatus. Thereafter in step S3, the film information is sent to the process apparatus. Finally in step S4, a film treatment is applied to the substrate in accordance with the film information.

Figure 6:
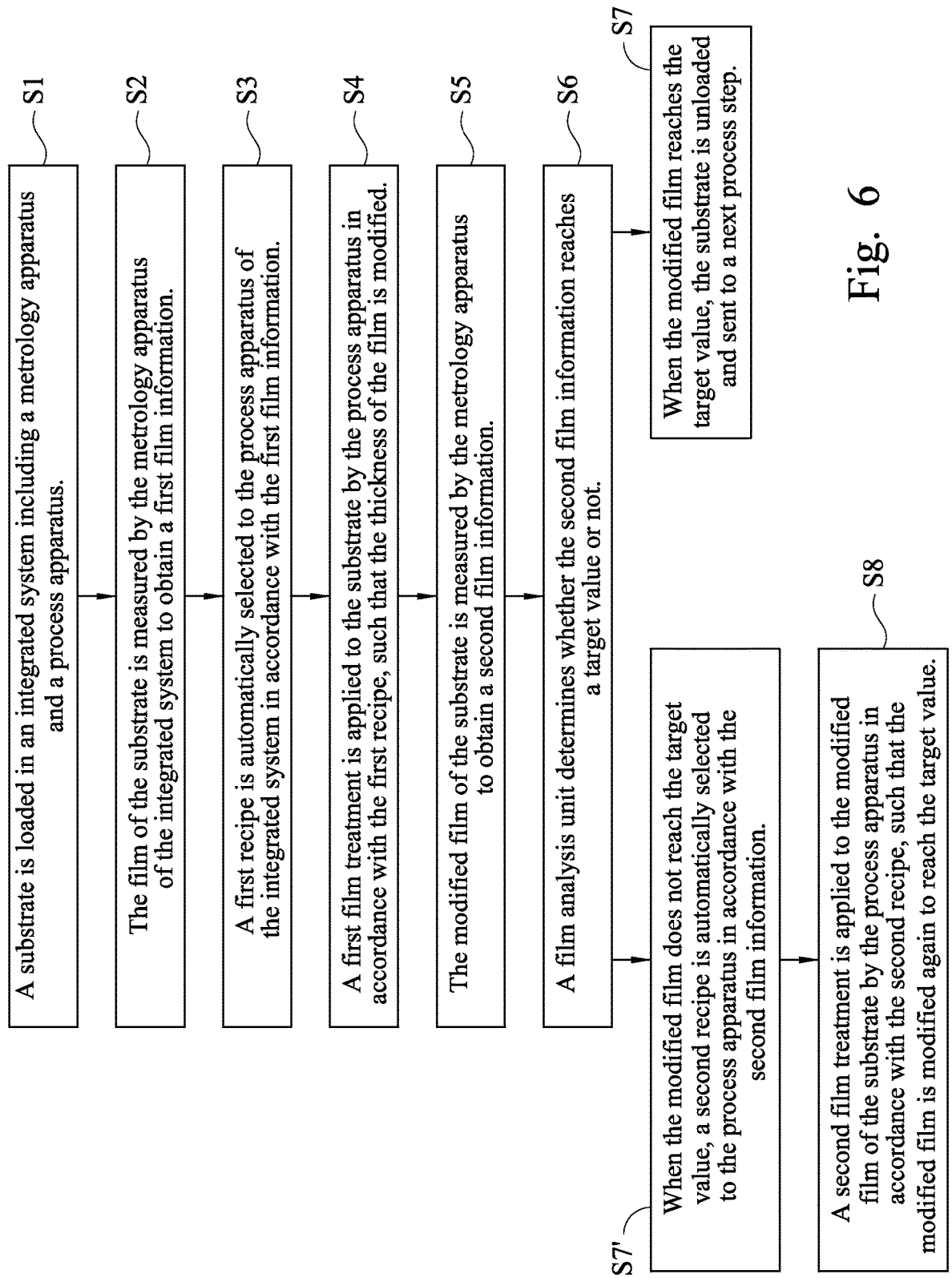
FIG. 6 is a flow chart of a film treatment method in accordance with some embodiments of the present disclosure.

FIG. 6 is a flow chart of a film treatment method in accordance with some embodiments of the present disclosure. As shown in FIG. 6, in step S1, a substrate is loaded in an integrated system. Next in step S2, the film of the substrate is measured by the metrology apparatus of the integrated system to obtain a first film information. Thereafter in step S3, a first recipe is automatically selected to the process apparatus of the integrated system in accordance with the first film information. Next in step S4, a first film treatment is applied to the substrate by the process apparatus in accordance with the first recipe, such that the thickness of the film is modified. Thereafter in step S5, the modified film of the substrate is measured by the metrology apparatus to obtain a second film information. Next in step S6, a film analysis unit determines whether the second film information reaches a target value or not.

Thereafter in step S7 or S7', when the modified film reaches the target value, the substrate is unloaded and sent to a next process step. However, when the modified film does not reach the target value, a second recipe is automatically selected to the process apparatus in accordance with the second film information.

When the modified film does not reach the target value, finally in step S8, a second film treatment is applied to the modified film of the substrate by the process apparatus in accordance with the second recipe, such that the modified film is modified again to reach the target value.

Figure 7:
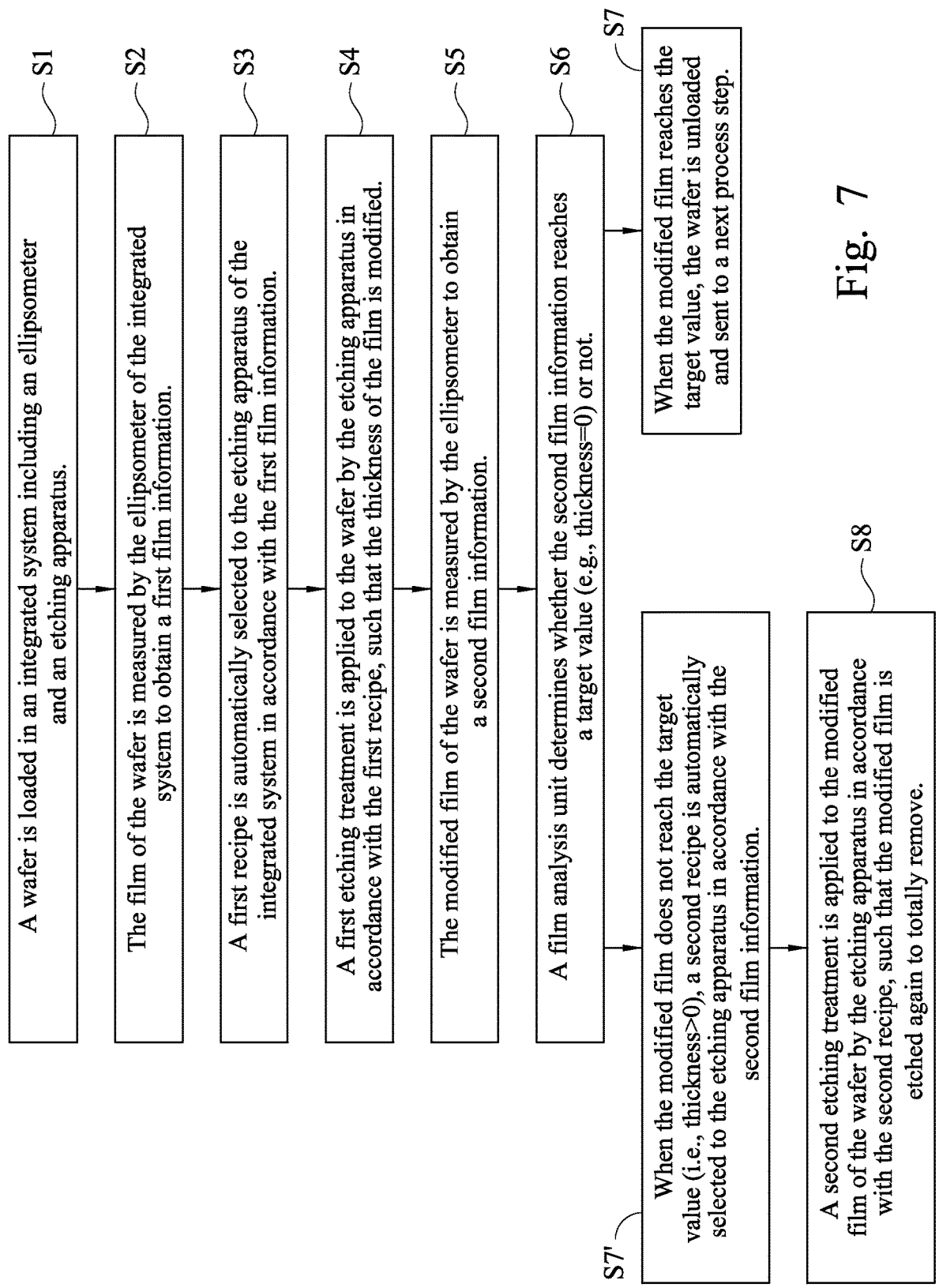
FIG. 7 is a flow chart of a film treatment method in accordance with some embodiments of the present disclosure.

FIG. 7 is a flow chart of a film treatment method in accordance with some embodiments of the present disclosure. As shown in FIG. 7, in step S1, a wafer is loaded in an integrated system. Next in step S2, the film of the wafer is measured by the ellipsometer of the integrated system to obtain a first film information. Thereafter in step S3, a first recipe is automatically selected to the etching apparatus of the integrated system in accordance with the first film information. Next in step S4, a first etching treatment is applied to the wafer by the etching apparatus in accordance with the first recipe, such that the thickness of the film is modified. Thereafter in step S5, the modified film of the wafer is measured by the ellipsometer to obtain a second film information. Next in step S6, a film analysis unit determines whether the second film information reaches a target value (e.g., thickness=0) or not.

Thereafter in step S7 or S7', when the modified film reaches the target value, the wafer is unloaded and sent to a next process step. However, when the modified film does not reach the target value (i.e., thickness>0), a second recipe is automatically selected to the etching apparatus in accordance with the second film information.

When the modified film does not reach the target value, finally in step S8, a second etching treatment is applied to the modified film of the wafer by the etching apparatus in accordance with the second recipe, such that the modified film is etched again to totally remove.

Figure 8:
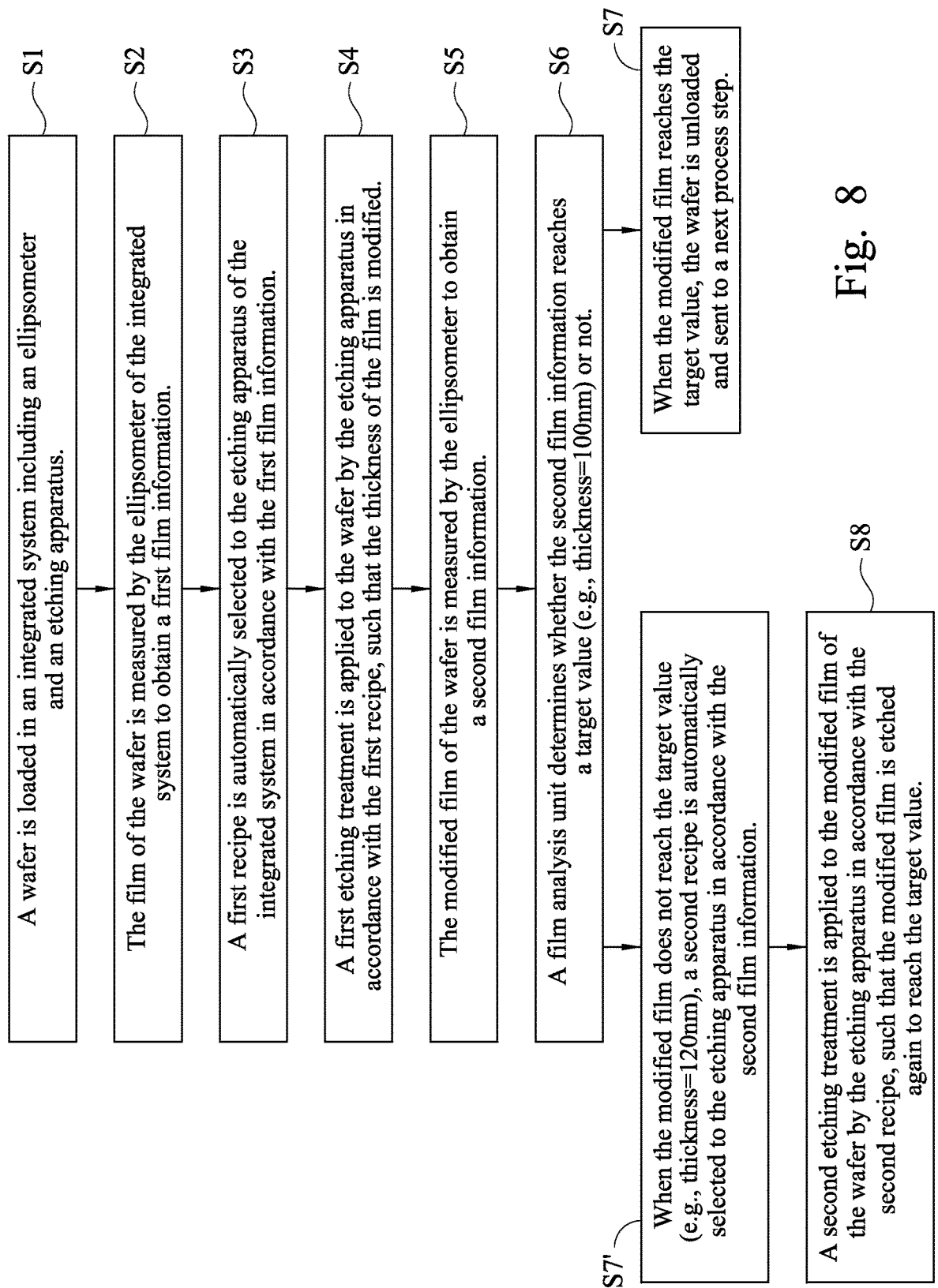
FIG. 8 is a flow chart of a film treatment method in accordance with some embodiments of the present disclosure.

FIG. 8 is a flow chart of a film treatment method in accordance with some embodiments of the present disclosure. As shown in FIG. 8, in step S1, a wafer is loaded in an integrated system. Next in step S2, the film of the wafer is measured by the ellipsometer of the integrated system to obtain a first film information. Thereafter in step S3, a first recipe is automatically selected to the etching apparatus of the integrated system in accordance with the first film information. Next in step S4, a first etching treatment is applied to the wafer by the etching apparatus in accordance with the first recipe, such that the thickness of the film is modified. Thereafter in step S5, the modified film of the wafer is measured by the ellipsometer to obtain a second film information. Next in step S6, a film analysis unit determines whether the second film information reaches a target value (e.g., thickness=100 nm) or not.

Thereafter in step S7 or S7', when the modified film reaches the target value, the wafer is unloaded and sent to a next process step. However, when the modified film does not reach the target value (e.g., thickness=120 nm), a second recipe is automatically selected to the etching apparatus in accordance with the second film information.

When the modified film does not reach the target value, finally in step S8, a second etching treatment is applied to the modified film of the wafer by the etching apparatus in accordance with the second recipe, such that the modified film is etched again to reach the target value. That is to say, the modified film is etched again to reduced the thickness of 20 nm.

Figure 9:
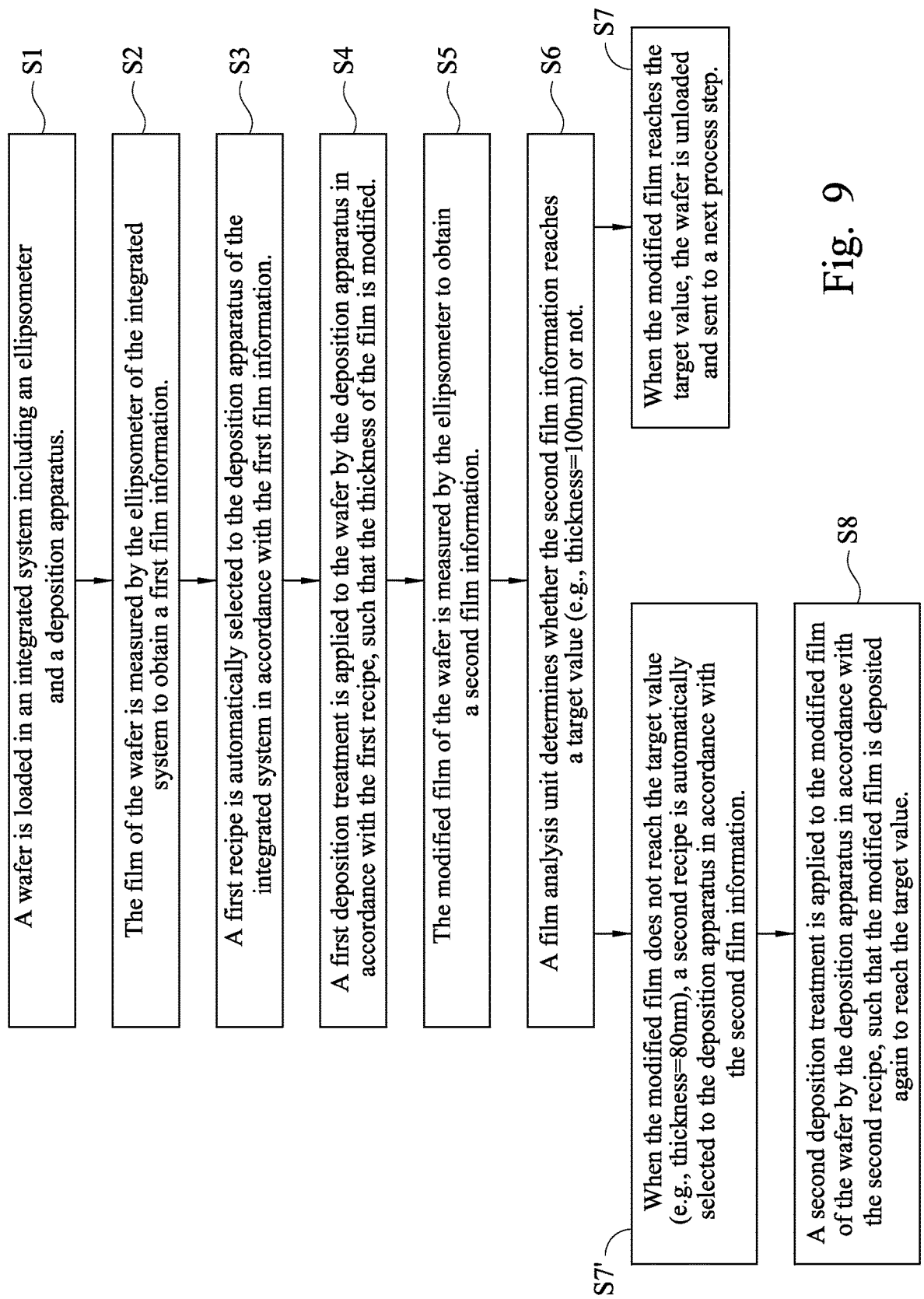
FIG. 9 is a flow chart of a film treatment method in accordance with some embodiments of the present disclosure.

FIG. 9 is a flow chart of a film treatment method in accordance with some embodiments of the present disclosure. As shown in FIG. 9, in step S1, a wafer is loaded in an integrated system. Next in step S2, the film of the wafer is measured by the ellipsometer of the integrated system to obtain a first film information. Thereafter in step S3, a first recipe is automatically selected to the deposition apparatus of the integrated system in accordance with the first film information. Next in step S4, a first deposition treatment is applied to the wafer by the deposition apparatus in accordance with the first recipe, such that the thickness of the film is modified. Thereafter in step S5, the modified film of the wafer is measured by the ellipsometer to obtain a second film information. Next in step S6, a film analysis unit determines whether the second film information reaches a target value (e.g., thickness=100 nm) or not.

Thereafter in step S7 or S7', when the modified film reaches the target value, the wafer is unloaded and sent to a next process step. However, when the modified film does not reach the target value (e.g., thickness=80 nm), a second recipe is automatically selected to the deposition apparatus in accordance with the second film information.

When the modified film does not reach the target value, finally in step S8, a second deposition treatment is applied to the modified film of the wafer by the deposition apparatus in accordance with the second recipe, such that the modified film is deposited again to reach the target value. That is to say, the modified film is deposited again to increase the thickness of 20 nm.

Figure 10:
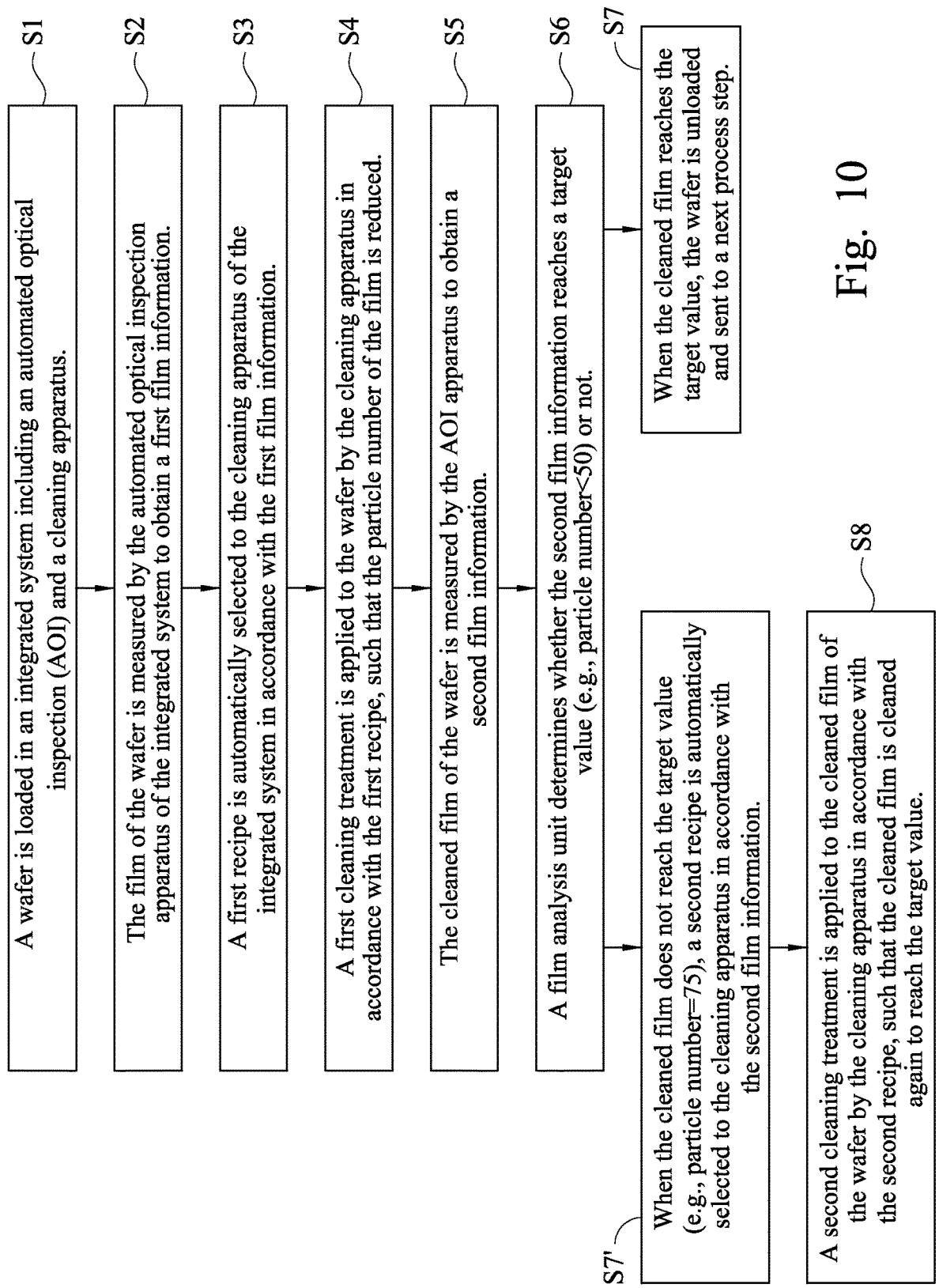
FIG. 10 is a flow chart of a film treatment method in accordance with some embodiments of the present disclosure.

FIG. 10 is a flow chart of a film treatment method in accordance with some embodiments of the present disclosure. As shown in FIG. 10, in step S1, a wafer is loaded in an integrated system. Next in step S2, the film of the wafer is measured by the automated optical inspection (AOI) apparatus of the integrated system to obtain a first film information. Thereafter in step S3, a first recipe is automatically selected to the cleaning apparatus of the integrated system in accordance with the first film information. Next in step S4, a first cleaning treatment is applied to the wafer by the cleaning apparatus in accordance with the first recipe, such that the particle number of the film is reduced. Thereafter in step S5, the cleaned film of the wafer is measured by the AOI apparatus to obtain a second film information. Next in step S6, a film analysis unit determines whether the second film information reaches a target value (e.g., particle number<50) or not.

Thereafter in step S7 or S7', when the cleaned film reaches the target value, the wafer is unloaded and sent to a next process step. However, when the cleaned film does not reach the target value (e.g., particle number=75), a second recipe is automatically selected to the cleaning apparatus in accordance with the second film information.

When the cleaned film does not reach the target value, finally in step S8, a second cleaning treatment is applied to the cleaned film of the wafer by the cleaning apparatus in accordance with the second recipe, such that the cleaned film is cleaned again to reach the target value. That is to say, the cleaned film is cleaned again to decrease at least 25 particles.

Compared with conventional metrology and process apparatuses, the integrated system, the integrated system operation method, and the film treatment method of the present disclosure can reduce of the cycle time of the substrate due to the integrated system having the metrology apparatus and the process apparatus. For example, the cycle time of depositing, etching, cleaning, and measuring the film of the substrate can be reduced. Moreover, the metrology apparatus and the process apparatus can communicate with each other, the process apparatus can automatically select an appropriate recipe in accordance with the film information measured by the metrology apparatus 120. As a result, the process control of the substrate can be improved and prevents human errors.

In this document, the term "contact" is also used to indicate the term "via."

In this document, the term "coupled" may also be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, an integrated system is disclosed that includes a process apparatus, a metrology apparatus, and a transfer apparatus. The process apparatus is used to apply a film treatment to a substrate. The metrology apparatus is immediately adjacent to the process apparatus to measure the film of the substrate. The transfer apparatus is used to move the substrate between the process apparatus and the metrology apparatus.

Also disclosed is an integrated system operation method that includes the operations below. The film of a substrate is measured by a metrology apparatus to obtain a film information. The substrate is moved from the metrology apparatus to a process apparatus adjacent to the transfer apparatus. The film information is sent to the process apparatus. A film treatment is applied to the substrate in accordance with the film information.

A film treatment method is also disclosed that includes the operations below. A substrate is loaded in an integrated system including a metrology apparatus and a process apparatus. The film of the substrate is measured by the metrology apparatus of the integrated system to obtain a first film information. A first recipe is automatically selected to the process apparatus of the integrated system in accordance with the first film information.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. An integrated system comprising:
at least one port configured to receive a substrate;
a process apparatus configured to apply a film treatment to the substrate;
a metrology apparatus configured to measure a film of the substrate and comprising a receiver configured to receive a light reflected by the film of the substrate for obtaining a film information;
a transfer apparatus electrically connected to the process apparatus and the metrology apparatus, having opposite first and second sides, and configured to move in a linear direction between the process apparatus and the metrology apparatus to move the substrate between the process apparatus and the metrology apparatus, wherein the process apparatus is disposed at the first side of the transfer apparatus and the second side of the transfer apparatus is free of a process apparatus;
a buffer chamber present adjacent to the process apparatus and accommodating the transfer apparatus and the metrology apparatus therein, wherein the at least one port forms a first interface with the buffer chamber, the process apparatus forms a second interface with the buffer chamber;
a film analysis unit configured to automatically select a recipe in accordance with the film information; and
a control system configured to send measuring information to the metrology apparatus to measure the film of the substrate with the metrology apparatus, and the metrology apparatus being further configured to send a first film information of a measured property of the film of the substrate to the process apparatus while sending a second film information of the measured property of the film of the substrate to the control system synchronously, wherein the first and second film information have substantially identical information.

2. The integrated system of claim 1, wherein the metrology apparatus comprises:
a transmitter configured to emit the light to the film of the substrate and electrically connected to the receiver.

3. The integrated system of claim 1, wherein the film analysis unit is located within the metrology apparatus or the process apparatus.

4. The integrated system of claim 1, wherein the metrology apparatus comprises:
a stage configured to support the substrate; and
a motor connected to the stage and configured to rotate the stage.

5. An integrated system operation method comprising:
transferring a substrate from a port to a metrology apparatus;
measuring a thickness of a film of a substrate with the metrology apparatus;
synchronously sending a first film information of the measured thickness of the film of the substrate to the process apparatus and a second film information of the measured thickness of the film of the substrate to the control system, wherein the first and second film information have substantially identical information;
moving the substrate from the metrology apparatus to a process apparatus by moving a transfer apparatus in a linear direction from the metrology apparatus to the process apparatus, wherein the transfer apparatus has opposite first and second sides, the process apparatus is disposed at the first side of the transfer apparatus, and the second side of the transfer apparatus is free of a process apparatus;
selecting a first recipe for modifying the thickness of the film based on information of the measured thickness of the film with the process apparatus; and
applying a first film treatment to the substrate in accordance with the selected first recipe, such that the thickness of the film of the substrate is modified by the process apparatus.

6. The method of claim 5, wherein measuring the thickness of the film of the substrate further comprises:
driving a transmitter and a receiver to obtain the information of the measured thickness of the film of the substrate.

7. The method of claim 5, wherein measuring the thickness of the film of the substrate further comprises:
rotating a stage that supports the substrate.

8. The method of claim 5, further comprising:
sending the information to a control system that is electrically connected to the process apparatus and the metrology apparatus.

9. The method of claim 6, wherein measuring the thickness of the film of the substrate further comprises:
emitting a light to the film of the substrate through the transmitter.

10. The method of claim 9, wherein measuring the first thickness of the film of the substrate further comprises:
receiving the light reflected by the film of the substrate through the receiver.

11. The method of claim 5, further comprising:
unloading the substrate from the process apparatus to the metrology apparatus or the port by a transfer apparatus.

12. An integrated system operation method, comprising:
transferring a substrate from a port to a metrology apparatus;
sending measuring information to the metrology apparatus with a control system;
measuring a property of a film of the substrate with the metrology apparatus based on the measuring information;
moving a transfer apparatus in a linear direction to move the substrate from the metrology apparatus to a process apparatus, wherein the transfer apparatus has opposite first and second sides, the process apparatus is disposed at the first side of the transfer apparatus, and the second side of the transfer apparatus is free of a process apparatus;
synchronously sending a first film information of the measured property of the film of the substrate to the process apparatus and a second film information of the measured property of the film of the substrate to the control system with the metrology apparatus, wherein the first and second film information have substantially identical information;
selecting a first recipe with the process apparatus for modifying the property of the film based on the film information;
applying a film treatment to the substrate with the process apparatus in accordance with the selected first recipe such that the property of the film of the substrate is modified by the process apparatus; and
measuring the modified property of the film of the substrate with the metrology apparatus.

13. The method of claim 12, further comprising the control system sending process information to the process apparatus such that the substrate is moved from the process apparatus back to the metrology apparatus or the port.

14. The integrated system of claim 1, wherein the metrology apparatus is disposed at the first side of the transfer apparatus.

15. The method of claim 5, further comprising:
after applying the first film treatment, transferring the substrate from the process apparatus to the metrology apparatus by the transfer apparatus;
measuring the modified thickness of the film with the metrology apparatus;
when the modified thickness of the film does not reach a target value, selecting a second recipe based on the measured modified thickness of the film; and
applying a second film treatment to the substrate in accordance with the selected second recipe by the process apparatus, such that the modified thickness of the film is modified again to reach the target value.

16. The method of claim 5, further comprising:
after applying the first film treatment, transferring the substrate from the process apparatus to the metrology apparatus by the transfer apparatus;
measuring the modified thickness of the film with the metrology apparatus;
when the modified thickness of the film does not reach a target value, selecting a second recipe based on the measured modified thickness of the film; and
applying a second film treatment to the substrate in accordance with the selected second recipe by the process apparatus, such that the film is totally removed.

17. The method of claim 12, further comprising:
after applying the film treatment, transferring the substrate from the process apparatus to the metrology apparatus by the transfer apparatus;
measuring the modified property of the film with the metrology apparatus, wherein the modified property of the film includes a modified particle number of the film;

when the modified particle number of the film does not reach a target value, selecting a second recipe based on the measured modified particle number of the film; and applying a cleaning treatment to the substrate in accordance with the selected second recipe by the process apparatus, such that the modified particle number of the film is modified again to reach the target value.

18. The method of claim 12, further comprising:

after applying the film treatment, transferring the substrate from the process apparatus to the metrology apparatus by the transfer apparatus;

measuring the modified property of the film with the metrology apparatus, wherein the modified property of the film includes a modified thickness of the film;

when the modified thickness of the film does not reach a target value, selecting a second recipe based on the measured modified thickness of the film; and applying a deposition treatment to the substrate in accordance with the selected second recipe by the process apparatus, such that the modified thickness of the film is modified again to reach the target value.

19. The method of claim 12, further comprising:

after applying the film treatment, transferring the substrate from the process apparatus to the metrology apparatus by the transfer apparatus;

measuring the modified property of the film with the metrology apparatus, wherein the modified property of the film includes a modified thickness of the film;

when the modified thickness of the film does not reach a target value, selecting a second recipe based on the measured modified thickness of the film; and applying an etching treatment to the substrate in accordance with the selected second recipe by the process apparatus, such that the modified thickness of the film is modified again to reach the target value.

20. The integrated system of claim 1, wherein the linear direction is parallel to a direction from the metrology apparatus toward the process apparatus.

* * * * *